United States Patent
Nix

(10) Patent No.: US 7,265,640 B1
(45) Date of Patent: Sep. 4, 2007

(54) CIRCUIT APPROACH FOR COMMON MODE CONTROL IN HIGH-FREQUENCY CLOCKS

(75) Inventor: Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 102 days.

(21) Appl. No.: 11/021,868

(22) Filed: Dec. 23, 2004

(51) Int. Cl.
*H03B 1/00* (2006.01)
*H03L 5/00* (2006.01)

(52) U.S. Cl. .................. 331/74; 331/183; 327/307; 327/332

(58) Field of Classification Search .................. 331/74; 31/182–183; 327/115, 307, 332
See application file for complete search history.

(56) References Cited

U.S. PATENT DOCUMENTS

| | | | |
|---|---|---|---|
| 5,202,647 A | * | 4/1993 | Muraki et al. .................. 331/74 |
| 2002/0039052 A1 | * | 4/2002 | Straub et al. .................. 331/45 |

OTHER PUBLICATIONS

U.S. Appl. No. 10/661,016, filed Sep. 11, 2003, Groen et al.

* cited by examiner

*Primary Examiner*—Robert Pascal
*Assistant Examiner*—James Goodley
(74) *Attorney, Agent, or Firm*—LeRoy D. Maunu; Michael T. Wallace

(57) ABSTRACT

An example embodiment is directed to shifting the common mode voltage of an analog oscillation stage toward a center line between the upper and lower power-supply rails of a first digital circuit. The first digital circuit has a digital input port adapted to respond to signal transitions defined between the supply rails, and the analog oscillation stage generates an oscillating analog signal that has a common-mode voltage that is not centered between the upper and lower power-supply rails. The oscillating analog signal, which drives the digital input port, changes alternately with the phases of the oscillating analog signal. To shift the common mode voltage of an analog oscillation stage toward the center line between the rails, a feedback circuit generates a contending digital signal that drives the digital input port with alternating states as defined by opposite phases.

21 Claims, 3 Drawing Sheets

CIRCUIT APPROACH FOR COMMON MODE CONTROL IN HIGH-FREQUENCY CLOCKS

FIELD OF THE INVENTION

The present invention relates generally to data processing circuits and, more particularly, to high-frequency clock circuits.

BACKGROUND OF THE INVENTION

Demands for high-speed data processing and communication continue to push the electronics industry to develop faster and higher-functioning circuits, as has been realized in very-large-scale integration of circuits on small areas of silicon wafer. Technologies such as telecommunications and networking, for example, continue to fuel research and design efforts that facilitate serial data rate capabilities on the order of hundreds of gigabits per second and higher.

Such data-processing speeds are defined relative to a clock source that provides one or more high-frequency signals to circuits (and/or functionally-defined circuit modules) that advance through their designed (logic) states in order to perform their designed operation. In a typical application, the clock source provides a high-frequency signal that is processed through divider circuits to generate and distribute the appropriate clock signals to the various modules so as to advance through their logic states at the appropriate rate. In this manner, the high-speed clock source permits such circuitry to achieve its high-speed data-processing operation.

The distribution of these clock signals in a typical high-speed data processing application requires careful management of the circuits that generate these clock signals to operational and data-integrity problems. In circuits operating at relatively high clock speeds, for example, in the 1 GHz area and certainly at frequencies above about 5 GHz, such management is especially important.

At such high clock speeds, signal distortion can be caused by a form of noise known as clock jitter and by common-mode voltage problems. Clock jitter refers to the deviation in a clock signal's actual transition in time from its ideal position in time, where the signal's actual transition may either lag or lead the ideal position in time. Clock jitter includes cycle-to-cycle jitter, which is the change in a signal's output transition from its corresponding position in the previous cycle, as well as period jitter, which is the maximum change in a signal's output transition from its ideal position. Since both forms of jitter are present in high-frequency clocks, the circuit designer attempting to achieve a maximum data rate would typically need to account for the short-term and long-term (accumulation of such jitter over time) effects of clock jitter.

At these higher clock speeds, the clock source is typically an analog circuit producing an analog signal that must interface with digital circuitry before a useful digital clock signal can be produced. The common-mode voltage carried by this analog signal presents additional potential for distortion that can also be carried through the system. Clock sources that oscillate at such high frequencies are typically designed to provide differential analog signals that oscillate in a narrow voltage range below the upper power supply rail, $V_{dd}$, and a high-impedance analog buffer is used to amplify this analog signal with sufficient swing for an input of a typical digital circuit. However, this amplified analog signal is also differential and it is carried by a common-mode DC voltage that is not centered between the upper and lower power supply rails, $V_{dd}$ and $V_{SS}$. Consequently, the typical amplification provided by the typical digital circuit over-amplifies the signal on one voltage swing and under-amplifies the signal on the opposite voltage swing. For example, where the digital circuit is an inverter, the inverter would over-amplify the signal's valleys and under-amplify the signal's peaks. The digital circuit therefore fails to recognize half of the input states presented at its digital input, and modules depending on this signal would not recognize the clock transitions and fail to advance at the correct times.

In situations where jitter is combined with this common-mode voltage problem, this distortion can adversely impact even less-sensitive circuits. These situations can arise when the clock signal swing is barely within an acceptable range relative to supply rails, and then clock jitter is introduced to the clock signal. In such situations, the clock-driven modules can improperly interpret clock transitions in the clock signal. In other instances and operating conditions, clock jitter can have the effect of momentarily negating the swing in the clock signal. Under theses scenarios, the intended clock transitions would not be recognized and therefore not cause the clock-drive modules to advance their respective logic states.

Various approaches have been used to manage these conditions and eliminate this concern. A typical approach, for example, has involved use of a conventional R-C (resistor-capacitor) filter and an operational amplifier. The clock signal passes through the R-C filter to provide a level-averaged signal to the operational amplifier. The operational amplifier then compares this level-averaged signal against a reference voltage. The operational amplifier is configured with a feedback circuit to adjust the common-mode voltage. While this type of approach is acceptable for many applications, many other applications must address ongoing demands for decreased circuit size and decreased component-count.

Another approach is to use circuitry that is specially designed to compensate for otherwise intolerable swing levels in the clock signal. With the above-discussed digital inverter example, this approach would involve adjusting the size of the inverter to compensate for the high common-mode voltage provided at the output of the analog buffer. However, because this size adjustment is particular to one operating environment (as defined, e.g., by processing, voltage and temperature operation specifications), this approach will work only for that particular environment.

Accordingly, an approach that addresses the aforementioned problems, as well as other related problems, is desirable.

SUMMARY OF THE INVENTION

Various aspects of the present invention are directed to a wide variety of applications including but necessarily limited to those applications having a high frequency clock source that cannot tolerate excessive low-level swings in the clock signal. Implementations of the present invention are intended to serve such applications in a manner that addresses and overcomes the above-mentioned issues as well as others.

According to a first example embodiment, the present invention is directed to a clock-signal circuit that includes a first digital circuit, an analog oscillation stage, and a feedback circuit. The first digital circuit has a digital input port adapted to respond to signal transitions defined between an upper power-supply rail and a lower power-supply rail. The analog oscillation stage generates an oscillating analog signal that has a common-mode voltage that is not centered between the upper and lower power-supply rails, changes alternately between first and second polarities as defined by alternating phases of the analog signal's swing, and that drives the digital input port. The feedback circuit generates a contending digital signal that also drives the digital input port with alternating states as defined by polarity phases that are opposite the phases of the analog signal.

According to another specific embodiment, the above-described feedback circuit includes a digital output port that provides a second digital input signal which also transitions between the upper and lower power-supply rails. The second digital input signal is generated to change alternately between first and second polarities as defined by phases that are opposite the alternating phases of analog signal and is arranged with the first digital circuit to drive its digital input port in a contentious manner and therein improve the centering of the common-mode voltage. According to a more specific embodiment, a clock-signal circuit includes first digital buffer circuit, an analog oscillation stage and a digital feedback circuit. The first digital buffer circuit has a digital input port adapted to respond to signal transitions defined between an upper power-supply rail and a lower power-supply rail and has a first number of inverter stages through which an output signal is generated. The analog oscillation stage includes an oscillator adapted to generate an oscillating analog signal that has a nominal frequency of at least 1 GHz, and includes an analog buffer adapted to amplify the oscillating analog signal and, therefrom, provide an amplified oscillating analog signal. The amplified oscillating analog signal has a common-mode voltage that is not centered between the upper and lower power-supply rails, and changes alternately between first and second polarities as defined by alternating phases of the analog signal, and drives the digital input port. The digital feedback circuit has a second number of inverter stages through which a contending digital signal is generated. The first and second numbers are, respectively, even and odd (or visa versa) so that the contending digital signal mitigates the effect of the common-mode voltage.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
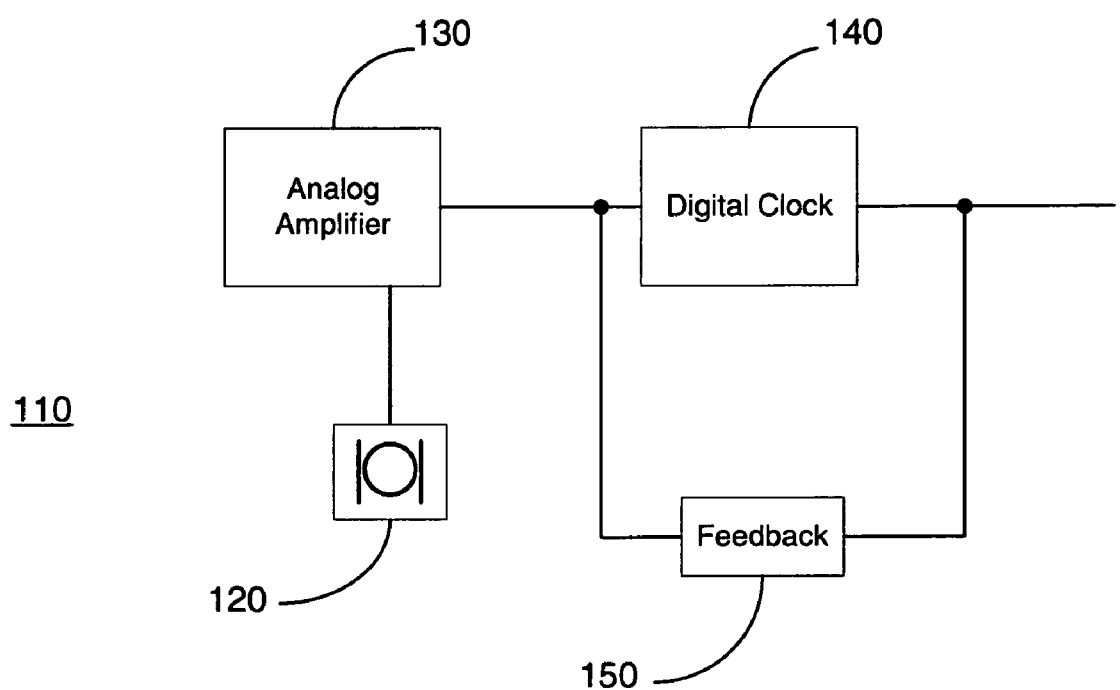
FIG. 1 is a schematic block diagram of a first clock circuit in accordance with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be generally applicable to digital high-speed clock circuits involving analog signals having off-centered common-mode-voltage components. The invention has been found to be particularly advantageous for high-speed clock applications that may be susceptible to jitter and/or may need to center the common-mode-voltage component in the analog signal at the analog source of the high-speed clock circuit. Examples of applications that might be sensitive to such issues include those implemented using general-purpose integrated circuits and programmable logic devices. While the present invention is not necessarily limited to such applications, an appreciation of various aspects of the invention is best gained through a discussion of examples in such an environment.

A first example embodiment of the present invention uses an analog crystal to generate an analog high-frequency clock signal at a front end of the clock circuit and uses a digital feedback approach to manage the common mode voltage in the analog high-frequency clock signal. The first digital circuit has a digital input port adapted to respond to signal transitions defined between the voltage supply rails. Only at start-up is the common-mode voltage not centered between the upper and lower power-supply rails. To shift the common mode voltage toward the center line, a feedback circuit tracks the phases of the analog high-frequency clock signal and, therefrom, produces a digital output signal having alternating states so as to define phases that are opposite the phases of the analog high-frequency clock signal. By connecting this digital signal (produced by the feedback circuit) to the first digital circuit's digital input port, the feedback circuit produces a level-contending digital signal that DC-centers the analog high-frequency clock signal.

FIG. 1 is a schematic block diagram 110 of a first clock circuit in accordance with the present invention. The resonating vibrations of an analog crystal 120 may produce an oscillating electrical signal with a frequency dependent upon a resonance frequency of the crystal. The oscillating signal produced by the crystal 120 may have a well defined frequency, but may have insufficient signal swing for the oscillating signal to be used as a clock signal for a digital circuit. Analog amplifier 130 amplifies the amplitude of the oscillating signal from the crystal 120 to produce an analog clock signal.

Generally an analog amplifier 130 does not output an analog clock signal that swings between a level near the lower supply voltage to a level near the upper supply voltage. Digital circuits prefer a digital clock that swings from rail-to-rail of the power supply. An analog amplifier 130 may output an analog clock signal with a shifted signal swing that approaches one rail of the power supply, but not the other rail. Such a shifted signal swing has an average voltage value, or common mode level, shifted from the midpoint between the power supply rails. Digital circuits typically have a switching voltage near the midpoint between the power supply rails. Generally the common mode level of the analog clock output from the analog amplifier 130 does not match the digital logic switching level.

The analog clock output from the analog amplifier 130 is further amplified by the digital clock buffer 140 to produce a digital clock. Because the analog clock input into the digital clock buffer 140 may have a shifted common mode level, the digital clock output by the digital clock buffer 140 may have deficiencies such as an imbalanced duty cycle. An imbalanced duty cycle can cause improper operation of the digital circuits especially when combined with clock jitter. The ratio of transistor sizes in the digital clock buffer 140 may be adjusted to compensate for the shifted common mode level, but such an adjustment requires additional circuit area and does not fully compensate through the full operating range of fabrication process, supply voltages, and temperature. An advantage of this form of compensation technique is its low component count and corresponding small circuit area.

A simple feedback circuit 150 can compensate for the shifted common mode level of the analog clock output from the digital clock buffer 140. The feedback circuit 150 provides compensation for the shifted common mode level across the full operating range of fabrication process, supply voltages and temperature. The feedback circuit 150 provides negative feedback that contends with the analog clock output from the analog amplifier 130. Typically, an analog amplifier 130 has a lower output impedance at the clock frequency, but a substantially higher common mode output impedance at DC. The feedback 150 is provided with an impedance between these two output impedances of the analog amplifier 130. Thus the analog amplifier 130 overdrives the feedback circuit 150 at the clock frequency, but the feedback circuit 150 overdrives the analog amplifier 130 at DC, thus subtracting the shifted common mode voltage.

Figure 2:
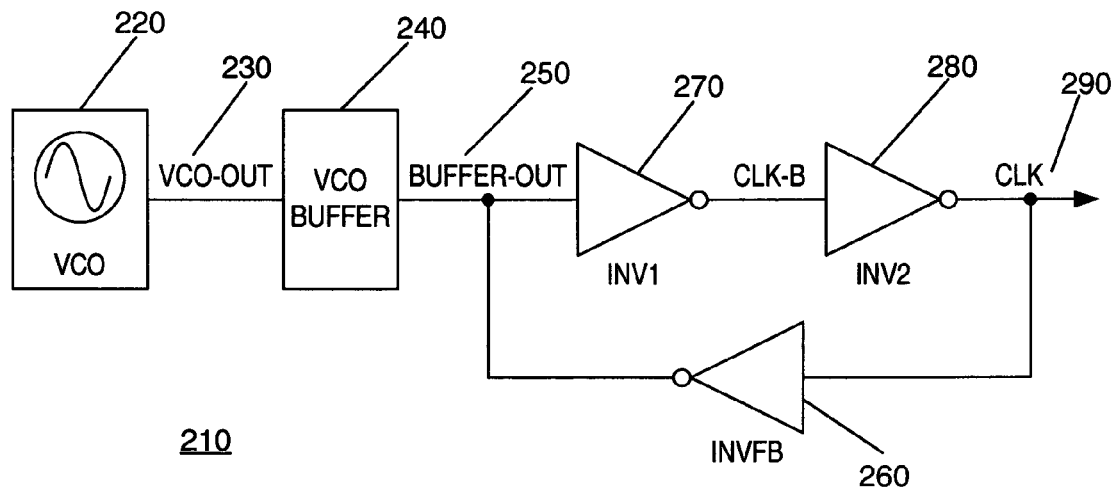
FIG. 2 is a schematic block diagram of a second clock circuit in accordance with the present invention.

FIG. 2 is a schematic block diagram 210 of a second clock circuit in accordance with an embodiment of the present invention. A voltage controlled oscillator 220 (VCO) is used to generate a clock frequency on the VCO output 230. Generally, a VCO is used to reach high operating frequencies at 1 GHz and above. An analog VCO buffer 240 with a high common mode output impedance amplifies the VCO output 230 to generate the VCO buffer output 250 in combination with feedback provided by the feedback inverter 260. The resulting signal 250 is amplified by the inverters 270 and 280 to generate a digital clock signal 290. With appropriate sizing of the inverter 260, the feedback of the clock signal 290 provided by inverter 260 adjusts the common mode level of the VCO buffer 250 without substantially reducing the signal swing of the VCO output 250.

At a high operating frequency for the clock signals 230, 250, and 290, the amplification provided by the inverters 270 and 280 may be limited to less than a full rail-to-rail signal swing by factors such as the slew rate of the inverters 270 and 280. Compensating by adjusting the ratio of transistor sizes in inverters 270 and 280, may not be possible at such a high frequency. At a frequency where less than a full rail-to-rail signal swing is provided by inverters 270 and 280, a shifted common mode level may cause the clock signal 290 to be dramatically impacted such that the oscillation disappears. Accordingly, certain embodiments of the present invention permit compensation for the common mode level of VCO buffer 240 at high frequencies.

Figure 3:
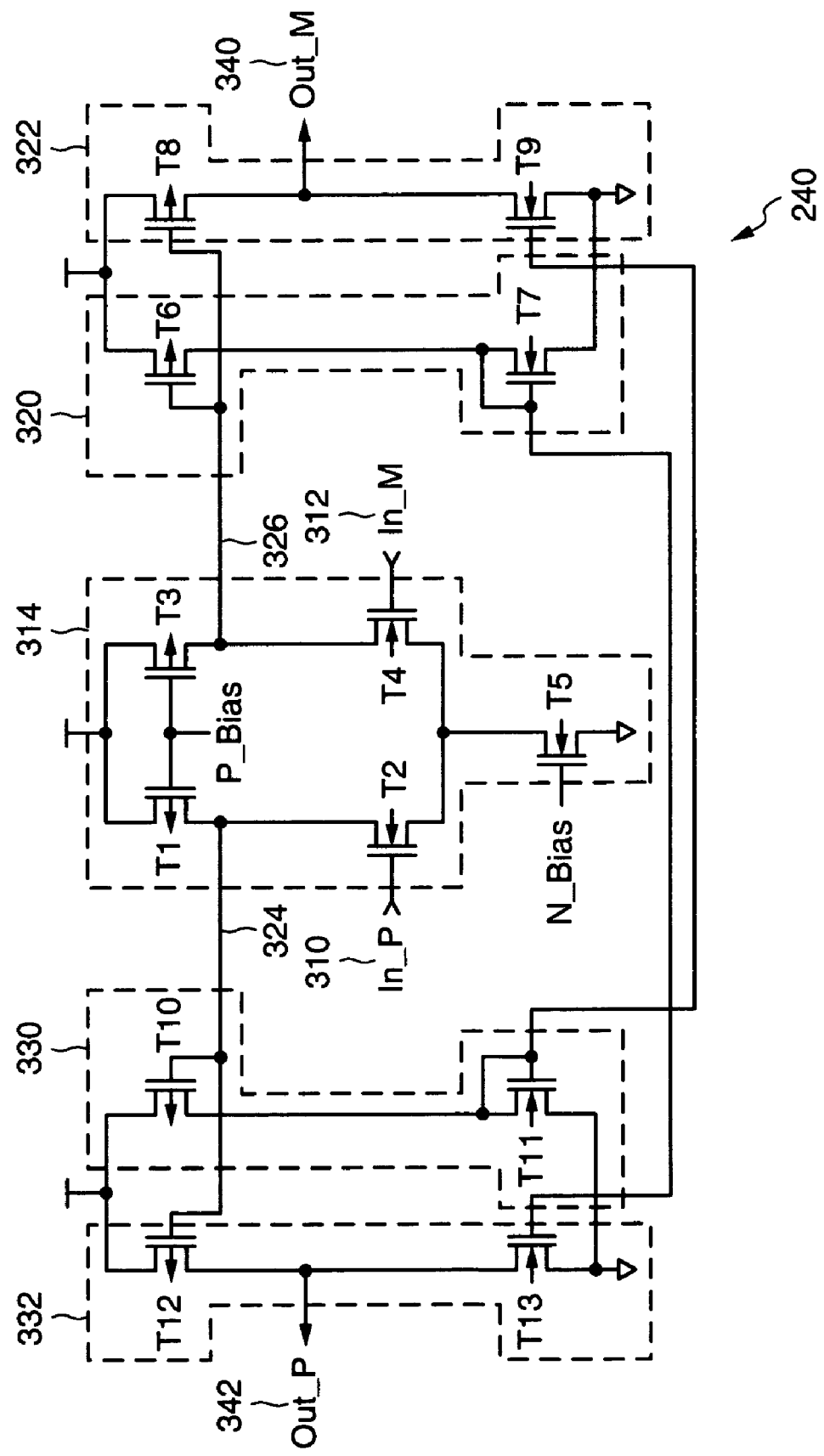
FIG. 3 is an example of a VCO buffer.

FIG. 3 is an example of a VCO buffer 240 of an embodiment of the present invention. The differential inputs are In_P 310 and In_M 312 into NMOS transistors T2 and T4 respectively. NMOS transistors T2, T4 and T5, along with PMOS transistors T1 and T3 are part of a differential input pair 314. An N-bias is input into transistor T5 and a P-bias is input into transistors T1 and T3. The positive output 324 of differential input pair 314 goes to current mirror 330, which includes transistors T10 and T11, and to output stage 332, which includes transistors T12 and T13. Current mirror 330 is associated with output stage 322 (the gate of transistor T11 is coupled to the gate of transistor T9). The positive differential output Out_P 342 is produced by output stage 332. The minus output 326 of differential input pair 314 goes to current mirror 320, which includes transistors T6 and T7, and to output stage 322, which includes transistors T8 and T9. Current mirror 320 is associated with output stage 332 (the gate of transistor T7 is coupled to the gate of transistor T13). The minus differential output Out_M 340 is produced by output stage 322.

VCO Buffer 240 is a high gain differential amplifier. The output of VCO buffer 240 below about 5 GHz is a rail-to-rail differential signal. However, as the frequency nears 5 GHz and above the output differential signal 290 of the VCO buffer 240 and associated inv1 270 and inv2 280 is no longer rail-to-rail and hence the common mode drifts up and down. The feedback invfb 260 then compensates for this common mode drift at high frequency.

One embodiment of the present invention is used in one or more MGTs as disclosed in U.S. patent application Ser. No. 10/661,016, entitled "PROGRAMMABLE LOGIC DEVICE INCLUDING PROGRAMMABLE MULTI-GIGABIT TRANSCEIVERS", by Eric D. Groen, et. al., filed Sep. 11, 2003, the application of which is herein incorporated by reference.

As one of ordinary skill in the art would appreciate, other embodiments may be derived from the teaching of the present invention without deviating from the scope of the claims.

What is claimed is:

1. A clock-signal circuit, comprising:
a first digital circuit having a digital input port adapted to respond to signal transitions defined between an upper power-supply rail and a lower power-supply rail;
an analog oscillation stage adapted to generate an oscillating analog signal that has a common-mode voltage not centered between the upper and lower power-supply rails, changes alternately between first and second polarities as defined by alternating phases of the oscillating analog signal, and that drives the digital input port; and
a feedback circuit adapted to generate a contending digital signal that drives the digital input port with alternating states as defined by polarity phases that are opposite the phases of the oscillating analog signal.

2. The circuit of claim 1, wherein the analog oscillation stage includes a voltage controlled oscillator (VCO) adapted to generate a first analog signal and includes a VCO buffer adapted to amplify the first analog signal and generate an amplified first analog signal.

3. The circuit of claim 2, wherein the amplified first analog signal is also the oscillating analog signal.

4. The circuit of claim 3, wherein the feedback circuit is a digital logic circuit.

5. The circuit of claim 4, wherein the first digital circuit further includes at least one output node that produces a signal in response to the alternating phases of the oscillating analog signal and that drives the feedback circuit.

6. The circuit of claim 1, wherein the first digital circuit has a digital output port for producing a digital clock signal that transitions between the upper and lower power-supply rails.

7. The circuit of claim 1, wherein the first digital circuit includes a digital output port and a signal-inverting digital logic circuit adapted to provide a certain number of digital signal inversion operations between the digital input port and the digital output port.

8. The circuit of claim 7, wherein the contending digital signal drives the digital input port as a function of said certain number of digital signal inversion operations between the digital input port and the digital output port.

9. The circuit of claim 1, wherein the first digital circuit includes a digital output port and a signal-inverting digital logic circuit adapted to provide a selected number of digital signal inversion operations between the digital input port and the digital output port, and wherein the contending digital signal drives the digital input port as a function of said selected number of digital signal inversion operations between the digital input port and the digital output port, wherein the oscillating analog signal oscillates at more than about 1 GHz and the selected number is less than about 5.

10. The circuit of claim 9, wherein the feedback circuit includes a signal-inverting digital logic circuit that begins at a circuit node connected to the digital output port of the first digital circuit and ends with the generation of the contending digital signal that drives the digital input port.

11. The circuit of claim 10, wherein the signal-inverting digital logic circuit of the feedback circuit is adapted to provide a different number of digital signal inversion operations.

12. A clock-signal circuit, comprising:
   first digital input means for responding to signal transitions defined between an upper power-supply rail and a lower power-supply rail;
   an analog oscillation stage adapted to generate an oscillating analog signal that has a common-mode voltage that is not centered between the upper and lower power-supply rails, changes alternately between first and second polarities as defined by alternating phases of the oscillating analog signal, and that drives the digital input port; and
   feedback means for generating a contending digital signal that drives the first digital input means with alternating states as defined by polarity phases that are opposite the phases of the oscillating analog signal.

13. A clock-signal circuit, comprising:
   a first digital circuit having a digital input port designed to receive a first digital input signal that transitions between an upper power-supply rail and a lower power-supply rail;
   an analog oscillation stage including an output port whereat the analog oscillation stage is adapted to generate an oscillating analog signal that has a common-mode voltage that is not centered between the upper and lower power-supply rails, changes alternately between first and second polarities as defined by alternating phases of the oscillating analog signal, and is arranged with the first digital circuit to drive its digital input port; and
   a feedback circuit adapted with a digital output port whereat the feedback circuit is further adapted provide a second digital input signal that also transitions between the upper and lower power-supply rails, the second digital input signal being generated to change alternately between first and second polarities as defined by phases that are opposite the alternating phases of the oscillating analog signal and being arranged with the first digital circuit to drive its digital input port and therein improve the centering of the common-mode voltage.

14. The circuit of claim 13, wherein the first digital circuit is a buffer having an even number of digital-signal inversion stages.

15. The circuit of claim 14, wherein the feedback circuit is an inverter.

16. The circuit of claim 13, wherein the first digital circuit is a buffer having a first number of digital-signal inversion stages, and wherein the feedback circuit is a buffer having a second number of digital-signal inversion stages, wherein the first number and the second number differ by one.

17. The circuit of claim 13, wherein the first digital circuit operates primarily as a buffer having only two digital-signal inversion stages, and wherein the feedback circuit operates primarily as a buffer.

18. The circuit of claim 17, wherein the feedback circuit operates primarily as an inverting buffer providing only one digital-signal inversion.

19. The circuit of claim 13, wherein the first digital circuit further includes at least one output node that produces a signal in response to the alternating phases of the oscillating analog signal and that drives the feedback circuit.

20. The circuit of claim 13, wherein the contending digital signal drives the digital input port as a function of said certain number of digital signal inversion operations between the digital input port and the digital output port.

21. A clock-signal circuit, comprising:
   a first digital buffer circuit having a digital input port adapted to respond to signal transitions defined between an upper power-supply rail and a lower power-supply rail and having a first number of inverter stages through which an output signal is generated;
   an analog oscillation stage including an oscillator adapted to generate an oscillating analog signal that has a nominal frequency of at least 1 GHz, and including an analog buffer adapted to amplify the oscillating analog signal and, therefrom, provide an amplified oscillating analog signal that has a common-mode voltage which is not centered between the upper and lower power-supply rails, and changes alternately between first and second polarities as defined by alternating phases of the oscillating analog signal, and that drives the digital input port; and
   a digital feedback circuit having a second number of inverter stages through which a contending digital signal, wherein one of the first and second numbers is even and the other of the first and second numbers is odd so that the contending digital signal is generated to mitigate a degree to which common-mode voltage swing is not centered between the upper and lower power-supply rails, by driving the digital input port with alternating states as defined by polarity phases that are opposite the phases of the oscillating analog signal.

* * * * *